United States Patent
Ikeda et al.

(10) Patent No.: US 10,453,879 B2
(45) Date of Patent: Oct. 22, 2019

(54) SOLID-STATE IMAGING DEVICE, IMAGING SYSTEM, AND MOVABLE OBJECT

(71) Applicant: CANON KABUSHIKI KAISHA, Tokyo (JP)

(72) Inventors: Hajime Ikeda, Yokohama (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/914,505

(22) Filed: Mar. 7, 2018

(65) Prior Publication Data

US 2018/0277575 A1 Sep. 27, 2018

(30) Foreign Application Priority Data

Mar. 21, 2017 (JP) .................................. 2017-054074

(51) Int. Cl.
*B60W 30/09* (2012.01)
*H04N 5/359* (2011.01)
(Continued)

(52) U.S. Cl.
CPC ......... *H01L 27/1461* (2013.01); *B60W 30/09* (2013.01); *H01L 27/14609* (2013.01);
(Continued)

(58) Field of Classification Search
CPC ............ B60W 2420/403; B60W 30/09; H01L 27/14609; H01L 27/1461; H01L 27/14623;
(Continued)

(56) References Cited

U.S. PATENT DOCUMENTS

| 7,462,810 B2 | 12/2008 | Kobayashi et al. | ........ 250/208.1 |
| 7,928,477 B2 | 4/2011 | Kobayashi et al. | .......... 257/225 |

(Continued)

FOREIGN PATENT DOCUMENTS

| JP | 2014-165286 A | 9/2014 |
| JP | 2014-165399 A | 9/2014 |

(Continued)

OTHER PUBLICATIONS

U.S. Appl. No. 15/862,292, filed Jan. 4, 2018.
(Continued)

*Primary Examiner* — Amy R Hsu
(74) *Attorney, Agent, or Firm* — Venable LLP

(57) ABSTRACT

A solid-state imaging device includes a plurality of pixels each including a photoelectric conversion unit, a first holding portion holding charges transferred from the photoelectric conversion unit, a second holding portion holding charges transferred from the first holding portion, and an amplifier unit outputting a signal based on charges in the second holding portion. The photoelectric conversion unit includes a first conductivity type first semiconductor region, a second conductivity type second semiconductor region thereunder, a first conductivity type third semiconductor region thereunder, and a second conductivity type fourth semiconductor region thereunder. The first holding portion includes a second conductivity type fifth semiconductor region and a first conductivity type sixth semiconductor region thereunder at a depth of the third semiconductor region being provided. A semiconductor region having a lower potential than the third semiconductor region and the sixth semiconductor region is provided between the third and sixth semiconductor regions.

20 Claims, 12 Drawing Sheets

(51) Int. Cl.
*H04N 5/374* (2011.01)
*H01L 27/146* (2006.01)

(52) U.S. Cl.
CPC .. *H01L 27/14623* (2013.01); *H01L 27/14643* (2013.01); *H01L 27/14656* (2013.01); *H04N 5/359* (2013.01); *H04N 5/374* (2013.01); *B60W 2420/403* (2013.01)

(58) Field of Classification Search
CPC ........ H01L 27/14643; H01L 27/14656; H04N 5/359; H04N 5/374
See application file for complete search history.

(56) References Cited

U.S. PATENT DOCUMENTS

| | | | |
|---|---|---|---|
| 7,935,995 B2 | 5/2011 | Watanabe et al. | 257/292 |
| 8,045,034 B2 | 10/2011 | Shibata et al. | 348/308 |
| 8,063,351 B2 | 11/2011 | Kobayashi et al. | 250/208.1 |
| 8,174,604 B2 | 5/2012 | Shibata et al. | 348/308 |
| 8,222,682 B2 | 7/2012 | Watanabe et al. | 257/292 |
| 8,259,206 B1 | 9/2012 | Shibata et al. | 348/308 |
| 8,289,432 B2* | 10/2012 | Shibata | H04N 5/378 250/208.1 |
| 8,357,956 B2 | 1/2013 | Kobayashi et al. | 257/225 |
| 8,456,559 B2 | 6/2013 | Yamashita et al. | 348/308 |
| 8,552,353 B2 | 10/2013 | Kobayashi et al. | 250/208.1 |
| 8,723,232 B2 | 5/2014 | Kobayashi et al. | 257/225 |
| 8,884,391 B2 | 11/2014 | Fudaba et al. | 257/432 |
| 9,147,708 B2 | 9/2015 | Okita et al. | H01L 27/1461 |
| 9,153,610 B2 | 10/2015 | Kobayashi et al. | H01L 27/14601 |
| 9,219,096 B2* | 12/2015 | Egawa | H01L 27/14806 |
| 9,276,027 B2 | 3/2016 | Okita et al. | H01L 27/1461 |
| 9,344,653 B2 | 5/2016 | Shimotsusa et al. | H04N 5/369 |
| 9,419,038 B2 | 8/2016 | Kobayashi et al. | H01L 27/14603 |
| 9,445,026 B2 | 9/2016 | Kobayashi et al. | H01L 27/14601 |
| 9,538,112 B2 | 1/2017 | Wada et al. | H04N 5/378 |
| 9,548,328 B2 | 1/2017 | Hasegawa et al. | H01L 27/14612 |
| 9,716,849 B2 | 7/2017 | Kobayashi et al. | H04N 5/361 |
| 9,768,213 B2 | 9/2017 | Soda et al. | H01L 27/14612 |
| 9,818,794 B2 | 11/2017 | Okita et al. | H01L 27/14812 |
| 9,876,975 B2 | 1/2018 | Yoshida et al. | H04N 5/3745 |
| 9,894,295 B2* | 2/2018 | Kawabata | H04N 5/3535 |
| 9,906,743 B2 | 2/2018 | Shimotsusa et al. | H04N 5/369 |
| 2011/0248371 A1* | 10/2011 | Matsumura | H01L 27/14612 257/443 |
| 2014/0061436 A1 | 3/2014 | Kobayashi | 250/208.1 |
| 2015/0060951 A1* | 3/2015 | Hynecek | H01L 27/14612 257/228 |
| 2016/0322406 A1 | 11/2016 | Kobayashi et al. | H01L 27/14603 |
| 2017/0077161 A1* | 3/2017 | Suzuki | H01L 27/14625 |
| 2017/0078557 A1 | 3/2017 | Kawabata et al. | H04N 5/23212 |
| 2017/0078604 A1 | 3/2017 | Kobayashi et al. | H01L 27/146 |
| 2017/0208272 A1* | 7/2017 | Guidash | H01L 27/1461 |
| 2017/0212221 A1 | 7/2017 | Goden et al. | G01S 7/4816 |
| 2017/0289478 A1 | 10/2017 | Kobayashi et al. | H04N 5/361 |
| 2017/0359535 A1 | 12/2017 | Kobayashi et al. | H04N 3/1525 |
| 2017/0359538 A1 | 12/2017 | Kobayashi et al. | H04N 5/35545 |
| 2017/0359539 A1* | 12/2017 | Kawabata | G02B 7/34 |
| 2018/0026073 A1 | 1/2018 | Tsuboi et al. | H01L 27/1463 |
| 2018/0098013 A1 | 4/2018 | Yoshida et al. | H04N 5/378 |
| 2018/0184036 A1* | 6/2018 | Sato | G02B 7/346 |

FOREIGN PATENT DOCUMENTS

| | | |
|---|---|---|
| JP | 2016-207791 A | 12/2016 |
| WO | 2016/203974 | 12/2016 |
| WO | 2016203974 | 12/2016 |

OTHER PUBLICATIONS

U.S. Appl. No. 15/791,909, filed Oct. 24, 2017.
U.S. Appl. No. 15/872,208, filed Jan. 16, 2018.
U.S. Appl. No. 15/955,146, filed Apr. 17, 2018.
European Search Report dated Sep. 17, 2018 during prosecution of related European application No. 18161673.1.
Japanese Office Action dated Jan. 22, 2019 during prosecution of related Japanese application No. 2017-054074. (English-language machine translation included.).

* cited by examiner

SOLID-STATE IMAGING DEVICE, IMAGING SYSTEM, AND MOVABLE OBJECT

BACKGROUND OF THE INVENTION

Field of the Invention

The present invention relates to a solid-state imaging device, an imaging system, and movable object.

Description of the Related Art

In solid-state imaging devices represented by CCD image sensors or CMOS image sensors, various consideration has been made to improve the sensitivity or the charge accumulation amount of a photoelectric conversion unit that generates signal carriers. As a photoelectric conversion unit of a solid-state imaging device, a use of the buried photodiode structure formed of a p-n junction of a p-type semiconductor region provided on the surface of a semiconductor substrate and an n-type semiconductor region forming a charge accumulation region is the mainstream. In this case, signal carriers generated in the photoelectric conversion unit are electrons.

Japanese Patent Application Laid-Open No. 2014-165286 discloses that a p-type semiconductor region having a higher concentration than a well is arranged under an n-type semiconductor region forming a charge accumulation region to increase the p-n junction capacitance and thereby the charge accumulation amount of the photoelectric conversion unit is increased. Further, Japanese Patent Application Laid-Open No. 2014-165286 discloses that an opening is provided in the p-type semiconductor region in order to prevent a reduction in the sensitivity due to the p-type semiconductor region being provided under the n-type semiconductor region as a charge accumulation region.

In recent years, in CMOS image sensors, it has been proposed to capture an image by using a global electronic shutter operation. The global electronic shutter operation is a drive method that performs capturing so as to match exposure periods among a plurality of pixels, which has an advantage that, even when capturing a subject that is moving fast, a subject image is less likely to be distorted. The object of improving the sensitivity or the charge accumulation amount of the photoelectric conversion unit described above similarly applies to a solid-state imaging device having a global electronic shutter function.

Pixels of a solid-state imaging device having a global electronic shutter function each have a holding portion for temporarily holding signal carriers separately from a photoelectric conversion unit. Since this holding portion holds signal carriers generated during an exposure period which are different from signal carriers held by the photoelectric conversion unit, it is highly important to suppress leakage of signal carriers from the photoelectric conversion unit into the holding portion.

In Japanese Patent Application Laid-Open No. 2014-165286, however, there is no consideration for application to a solid-state imaging device having a global electronic shutter function. Thus, the configuration disclosed in Japanese Patent Application Laid-Open No. 2014-165286 is insufficient to suppress leakage of signal carriers from the photoelectric conversion unit into the holding portion.

SUMMARY OF THE INVENTION

An object of the present invention is to provide a solid-state imaging device and an imaging system that can improve the sensitivity or the charge accumulation amount of a photoelectric conversion unit while reducing noise due to leaking of signal carriers from the photoelectric conversion unit into a separate holding portion.

According to an aspect of the present invention, there is provided a solid-state imaging device including a plurality of pixels each of which includes a photoelectric conversion unit that generates charges by photoelectric conversion, a first holding portion that holds charges transferred from the photoelectric conversion unit, a second holding portion that holds charges transferred from the first holding portion, and an amplifier unit that outputs a signal based on an amount of charges held by the second holding portion, wherein the photoelectric conversion unit includes a first semiconductor region of a first conductivity type provided on a surface of a semiconductor substrate, a second semiconductor region of a second conductivity type provided under the first semiconductor region and adapted to accumulate the generated charges, a third semiconductor region of the first conductivity type provided under the second semiconductor region, and a fourth semiconductor region of the second conductivity type provided under the third semiconductor region, wherein the first holding portion includes a fifth semiconductor region of the second conductivity type provided spaced apart from the second semiconductor region, and a sixth semiconductor region of the first conductivity type provided under the fifth semiconductor region at a depth of the third semiconductor region being provided, and wherein a semiconductor region having a lower potential than each of the third semiconductor region and the sixth semiconductor region is provided between the third semiconductor region and the sixth semiconductor region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
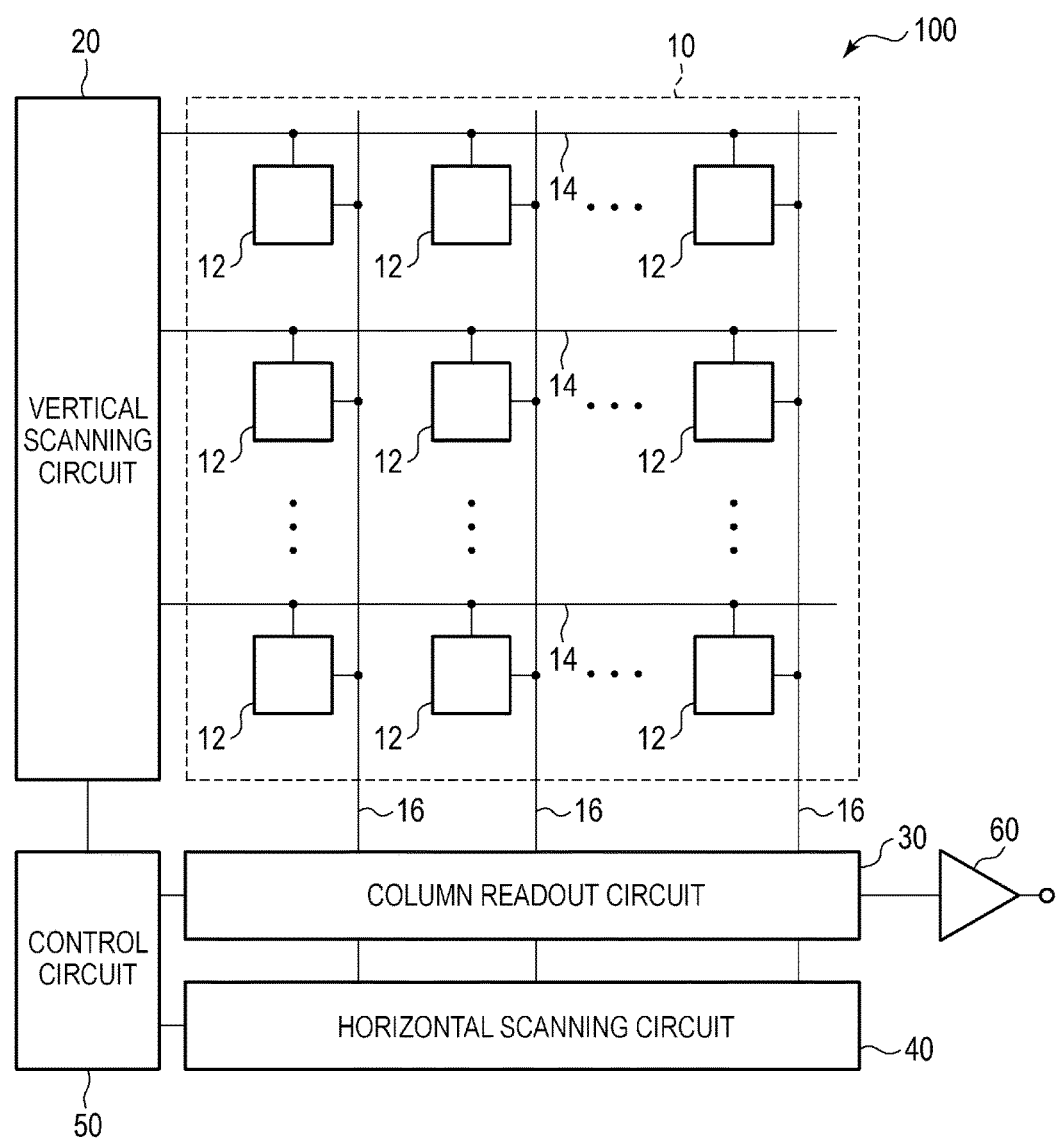
FIG. 1 is a block diagram illustrating a general configuration of a solid-state imaging device according to a first embodiment of the present invention.
Figure 2:
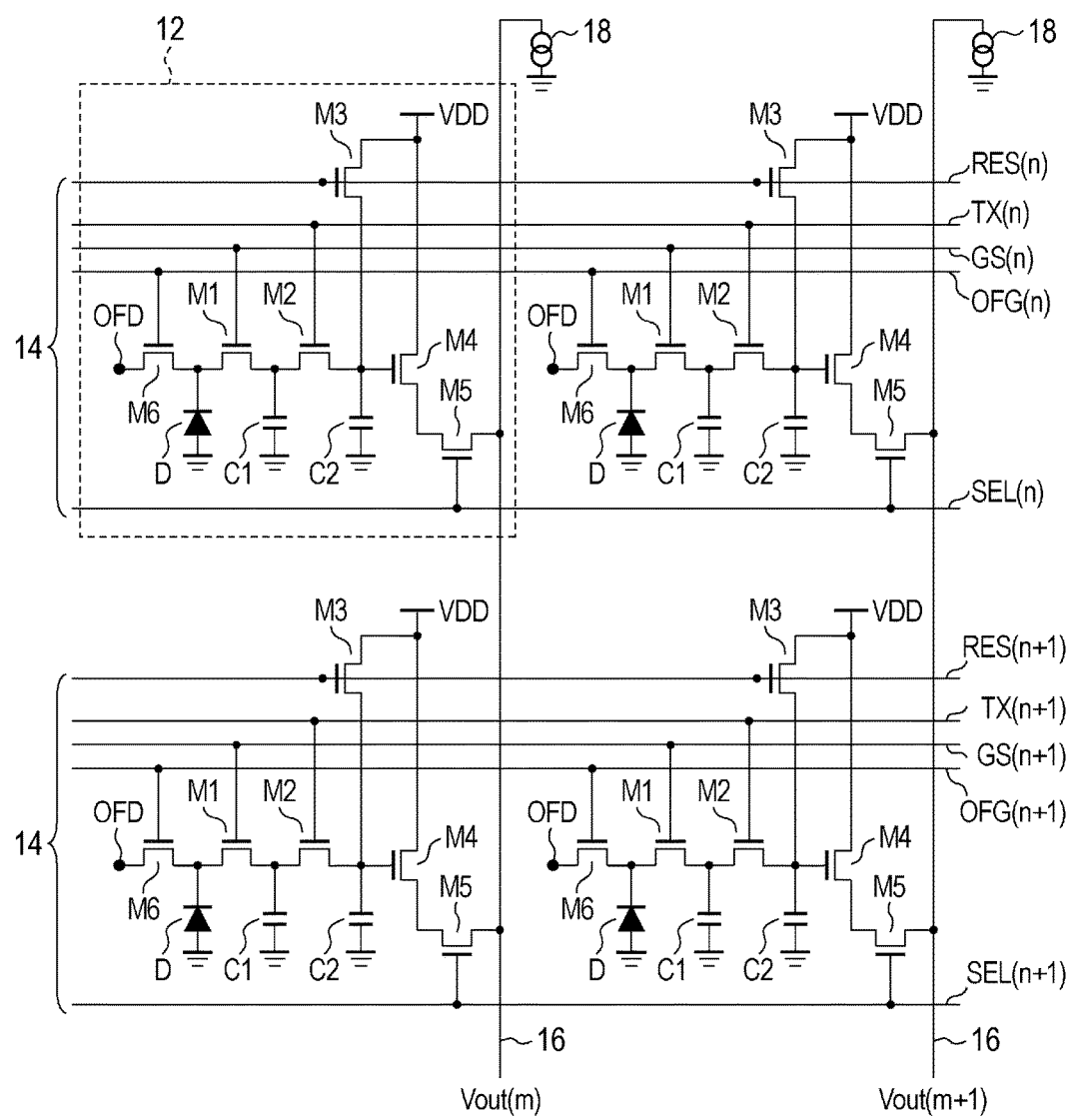
FIG. 2 is an equivalent circuit diagram of pixels of the solid-state imaging device according to the first embodiment of the present invention.
Figure 3:
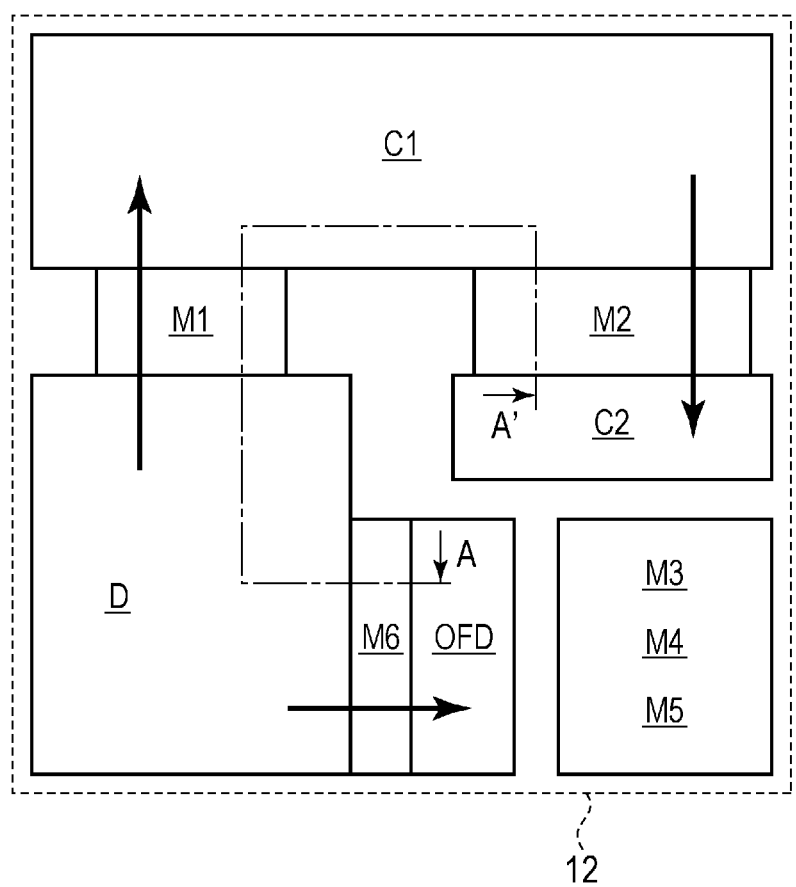
FIG. 3, FIG. 5A, and FIG. 5B are plan views of a pixel of the solid-state imaging device according to the first embodiment of the present invention.
Figure 4:
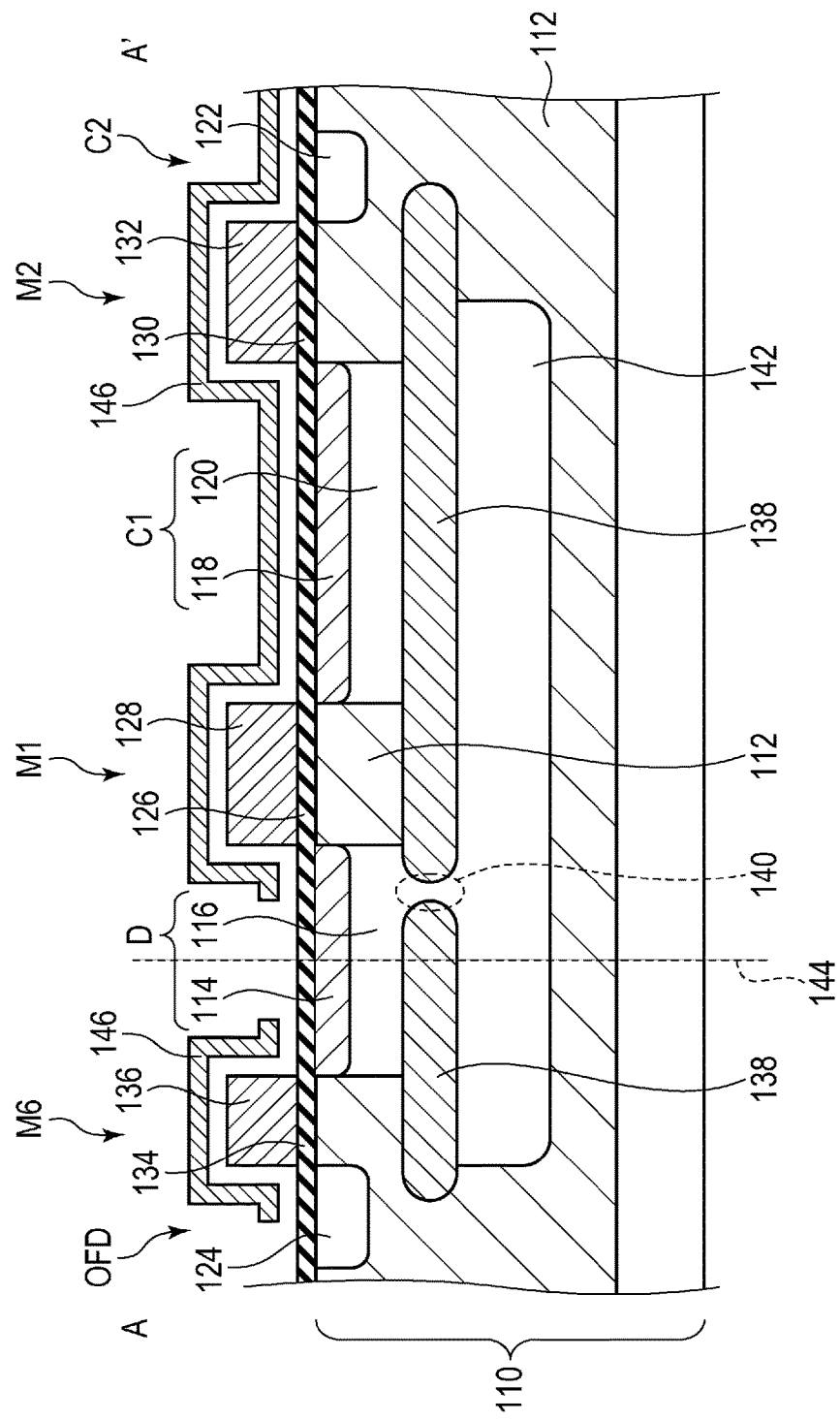
FIG. 4 is a cross-sectional view of the pixel of the solid-state imaging device according to the first embodiment of the present invention.
Figure 5A:
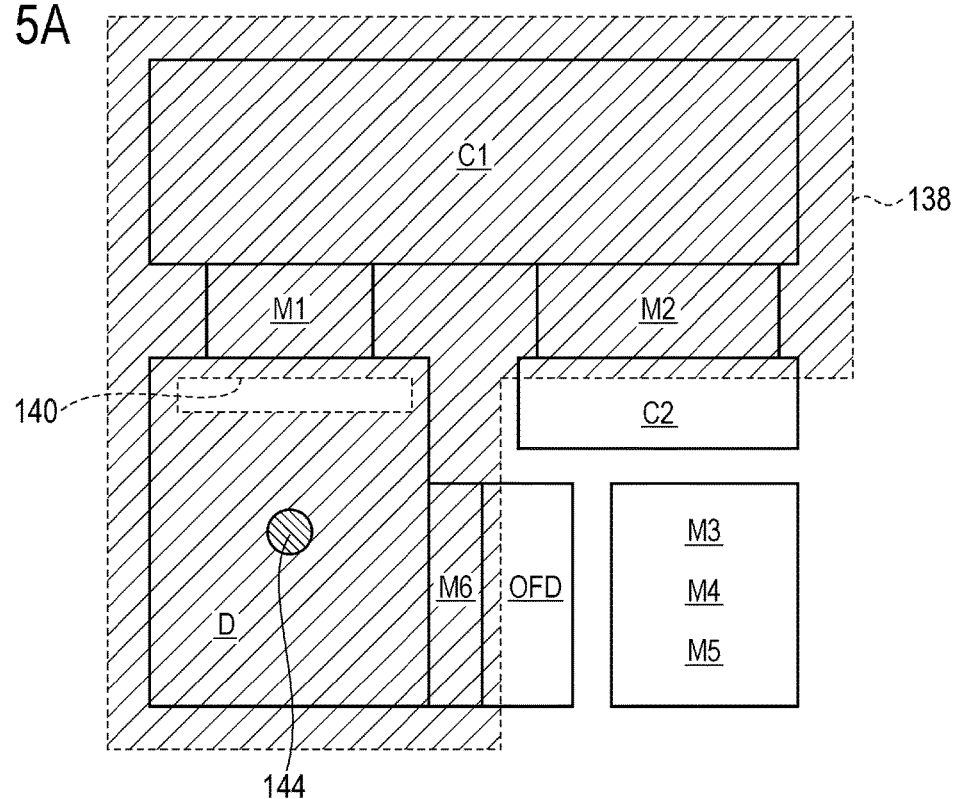
Figure 5B:
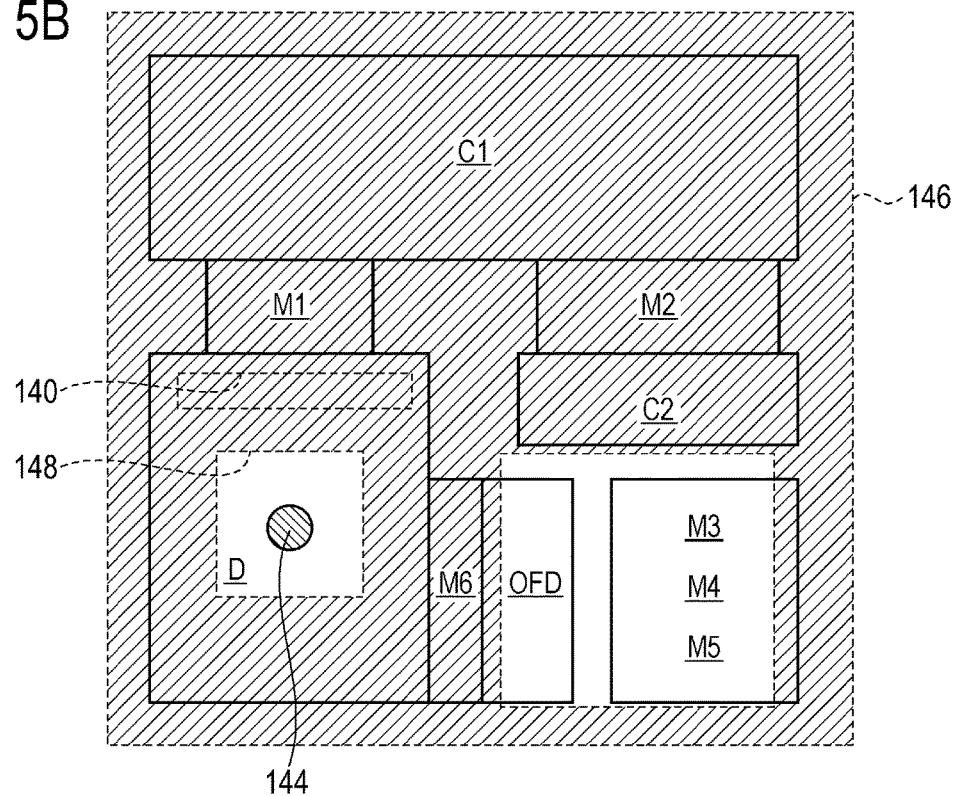

A solid-state imaging device according to a first embodiment of the present invention will be described with reference to FIG. 1 to FIG. 5B. FIG. 1 is a block diagram illustrating a general configuration of a solid-state imaging device according to the present embodiment. FIG. 2 is an equivalent circuit diagram of pixels of the solid-state imaging device according to the present embodiment. FIG. 3, FIG. 5A, and FIG. 5B are plan views of a pixel of the solid-state imaging device according to the present embodiment. FIG. 4 is a cross-sectional view of the pixel of the solid-state imaging device according to the present embodiment.

As illustrated in FIG. 1, the imaging device 100 according to the present embodiment includes a pixel region 10, a vertical scanning circuit 20, a column readout circuit 30, a horizontal scanning circuit 40, a control circuit 50, and an output circuit 60.

In the pixel region 10, a plurality of pixels 12 are provided arranged in a matrix over a plurality of rows by a plurality of columns. On each of the rows of a pixel array in the pixel region 10, a control signal line 14 is arranged extending in the row direction (the horizontal direction in FIG. 1). The control signal line 14 is connected to respective pixels 12 aligned in the row direction, which is a signal line common to these pixels 12. Further, on each of the columns of the pixel array in the pixel region 10, a vertical output line 16 is arranged extending in the column direction (the vertical direction in FIG. 1). The vertical output line 16 is connected to respective pixels 12 aligned in the column direction, which is a signal line common to these pixels 12.

The control signal line 14 on each row is connected to the vertical scanning circuit 20. The vertical scanning circuit 20 is a circuit unit that supplies, to the pixels 12 via the control signal lines 14, control signals for driving readout circuits in the pixels 12 when reading out pixel signals from the pixels 12. One end of the vertical output line 16 on each column is connected to the column readout circuit 30. Pixel signals read out from the pixels 12 are input to the column readout circuit 30 via the vertical output lines 16. The column readout circuit 30 is a circuit unit that performs predetermined signal processing, for example, signal processing such as an amplification process or an analog-to-digital (AD) conversion process on the pixel signals read out from the pixels 12. The column readout circuit 30 may include a differential amplifier circuit, a sample-and-hold circuit, an AD conversion circuit, or the like.

The horizontal scanning circuit 40 is a circuit unit that supplies, to the column readout circuit 30, control signals for transferring the pixel signals processed in the column readout circuit 30 to the output circuit 60 sequentially on a column basis. The control circuit 50 is a circuit unit that supplies control signals for controlling operations and the timings of the operations of the vertical scanning circuit 20, the column readout circuit 30, and the horizontal scanning circuit 40. The output circuit 60 is a circuit unit that is formed of a buffer amplifier, a differential amplifier, or the like and outputs the pixel signals read out from the column readout circuit 30 to a signal processing unit outside the solid-state imaging device 100.

FIG. 2 is a circuit diagram illustrating an example of pixel circuits forming the pixel region 10. While FIG. 2 illustrates four pixels 12 arranged in two rows by two columns out of the pixels 12 forming the pixel region 10, the number of pixels 12 forming the pixel region 10 is not limited in particular.

Each of the plurality of pixels 12 includes a photoelectric conversion unit D, transfer transistors M1 and M2, a reset transistor M3, an amplifier transistor M4, a select transistor M5, and an overflow transistor M6. The photoelectric conversion unit D is a photodiode, for example. The anode of the photodiode of the photoelectric conversion unit D is connected to the ground voltage line, and the cathode thereof is connected to the source of the transfer transistor M1 and the source of the overflow transistor M6. The drain of the transfer transistor M1 is connected to the source of the transfer transistor M2. A capacitance component parasitically coupled to the connection node of the drain of the transfer transistor M1 and the source of the transfer transistor M2 has a function as a charge holding portion. FIG. 2 depicts such a capacitance component as a capacitor (C1). This capacitor may be denoted as a holding portion C1 in the following description.

The drain of the transfer transistor M2 is connected to the source of the reset transistor M3 and the gate of the amplifier transistor M4. The connection node of the drain of the transfer transistor M2, the source of the reset transistor M3, and the gate of the amplifier transistor M4 is a so-called floating diffusion (FD) region. A capacitance component parasitically coupled to the FD region (floating diffusion capacitor) has a function as a charge holding portion. FIG. 2 depicts this capacitance component as a capacitor (C2) connected to the FD region. The FD region may be denoted as a holding portion C2 in the following description. The drain of the reset transistor M3 and the drain of the amplifier transistor M4 are connected to a power source voltage line (VDD). Note that the voltage supplied to the drain of the reset transistor M3 and the voltage supplied to the drain of the amplifier transistor M4 may be the same as each other or may be different from each other. The source of the amplifier transistor M4 is connected to the drain of the select transistor M5. The source of the select transistor M5 is connected to the vertical output line 16.

The control signal lines 14 are arranged extending in the row direction (the horizontal direction in FIG. 2) for each row of the pixel array of the pixel region 10. The control signal lines 14 on each row include a control line GS, a control line TX, a control line RES, a control line SEL, and a control line OFG. The control line GS is connected to the gates of the transfer transistors M1 of the pixels 12 aligned in the row direction, respectively, which is a signal line common to these pixels 12. The control line TX is connected to the gates of the transfer transistors M2 of the pixels 12 aligned in the row direction, respectively, which is a signal line common to these pixels 12. The control line RES is connected to the gates of the reset transistors M3 of the pixels 12 aligned in the row direction, respectively, which is a signal line common to these pixels 12. The control line SEL is connected to the gates of the select transistors M5 of the pixels 12 aligned in the row direction, respectively, which is a signal line common to these pixels 12. The control line OFG is connected to the gates of the overflow transistors M6 of the pixels 12 aligned in the row direction, respectively, which is a signal line common to these pixels 12. Note that, in FIG. 2, the name of each control line is appended with a corresponding row number (for example, GS(n), GS(n+1)).

The control lines GS, the control lines TX, the control lines RES, the control lines SEL, and the control lines OFG are connected to the vertical scanning circuit 20. A drive pulse for controlling the transfer transistor M1 is output to the control line GS from the vertical scanning circuit 20. A drive pulse for controlling the transfer transistor M2 is output to the control line TX from the vertical scanning circuit 20. A drive pulse for controlling the reset transistor M3 is output to the control line RES from the vertical scanning circuit 20. A drive pulse for controlling the select transistor M5 is output to the control line SEL from the vertical scanning circuit 20. A drive pulse for controlling the overflow transistor M6 is output to the control line OFG from the vertical scanning circuit 20. These control signals are supplied from the vertical scanning circuit 20 in accordance with predetermined timing signals from the control circuit 50. A logic circuit such as a shift resistor, an address decoder, or the like is used for the vertical scanning circuit 20.

The vertical output lines 16 are arranged extending in the column direction (the vertical direction in FIG. 2) for respective rows of the pixel array of the pixel region 10. Each of the vertical output lines 16 is connected to the sources of the select transistors M5 of the pixels 12 aligned in the column direction, which is a signal line common to these pixels 12. The vertical output line 16 is connected with a current source 18.

The photoelectric conversion unit D converts (photoelectrically converts) an incident light into charges of an amount in accordance with the light amount and accumulates the generated charges. The overflow transistor M6 drains charges accumulated in the photoelectric conversion unit D to the drain thereof. In this case, the drain OFD of the overflow transistor M6 may be connected to the power source voltage line (VDD).

The transfer transistor M1 transfers charges held in the photoelectric conversion unit D to the holding portion C1. The transfer transistor M1 operates as the global electronic shutter. The holding portion C1 holds charges generated by the photoelectric conversion unit D in a position different from the photoelectric conversion unit D. The transfer transistor M2 transfers charges held in the holding portion C1 to the holding portion C2. The holding portion C2 holds charges transferred from the holding portion C1 and sets the voltage of the input node of an amplifier portion (the gate of the amplifier transistor M4) to a voltage in accordance with the capacitance thereof and the amount of the transferred charges.

The reset transistor M3 resets the holding portion C2 to a predetermined voltage in accordance with the voltage VDD. In this case, it is also possible to reset the holding portion C1 by turning on the transfer transistor M2. Furthermore, it is also possible to reset the photoelectric conversion unit D by further turning on the transfer transistor M1.

The select transistor M5 selects the pixel 12 from which a signal is output to the output line 16. The amplifier transistor M4 is configured such that the voltage VDD is supplied to the drain and a bias current is supplied to the source from the current source 18 via the select transistor M5, which forms an amplifier portion (a source follower circuit) in which the gate is the input node. Thereby, the amplifier transistor M4 outputs a signal Vout based on charges generated by an incident light to the vertical output line 16. Note that, in FIG. 2, the signal Vout is appended with the corresponding column number (Vout(m), Vout(m+1)).

Such a configuration allows charges generated by the photoelectric conversion unit D to be accumulated in the photoelectric conversion unit D while the holding portion C1 is holding charges. This enables an image capturing operation in which exposure periods are matched among the plurality of pixels 12, namely, a so-called global electronic shutter operation. Note that electronic shutter means electrical control of accumulation of charges generated by an incident light.

FIG. 3 illustrates an example of a planar layout of the pixel 12 in the solid-state imaging device according to the present embodiment. While each region where each element of the pixel 12 is provided is depicted with a rectangular block in FIG. 3 for simplified illustration, each block is not intended to illustrate the shape of each element but is intended to illustrate that at least a part of the element is arranged inside each area. For example, regions corresponding to the transfer transistors M1 and M2 and the overflow transistor M6 approximately correspond to regions where the gates of respective transistors are arranged. Further, the region where the reset transistor M3, the amplifier transistor M4, and the select transistor M5 are provided is represented as one region.

The photoelectric conversion unit D, the transfer transistor M1, the holding portion C1, the transfer transistor M2, and the holding portion C2 are arranged so as to be adjacent to each other in this order within a unit region of the pixel 12. The overflow transistor M6 is arranged adjacent to the photoelectric conversion unit D. Arrows depicted in FIG. 3 illustrate a transfer direction of charges when the transfer transistors M1 and M2 and the overflow transistor M6 are driven. That is, when the transfer transistor M1 is driven, charges of the photoelectric conversion unit D are transferred to the holding portion C1. When the transfer transistor M2 is driven, charges of the holding portion C1 are transferred to the holding portion C2. When the overflow transistor M6 is driven, charges of the photoelectric conversion unit D are transferred (drained) to the drain OFD of the overflow transistor M6.

FIG. 4 is a schematic cross-sectional view taken along the line A-A' of FIG. 3. A p-type semiconductor region 112 (seventh semiconductor region) forming a well is provided on the surface of an n-type semiconductor substrate 110. Note that, in an example, the p-type is a first conductivity type and the n-type is a second conductivity type. The photoelectric conversion unit D, the holding portion C1, an n-type semiconductor region 122, and an n-type semiconductor region 124 are arranged spaced apart from each other on the surface of the p-type semiconductor region 112. Note that the description of the reset transistor M3, the amplifier transistor M4, and the select transistor M5 that do not appear in the cross-section of FIG. 4 are omitted here.

The photoelectric conversion unit D is a buried photodiode including a p-type semiconductor region 114 (first semiconductor region) in contact with the surface of the semiconductor substrate 110 and an n-type semiconductor region 116 (second semiconductor region) provided under the p-type semiconductor region 114. The n-type semiconductor region 116 is a charge accumulation layer for accumulating signal charges (electrons) generated by the photoelectric conversion unit D. The holding portion C1 has the buried photodiode structure including a p-type semiconductor region 118 (eighth semiconductor region) in contact with the surface of the semiconductor substrate 110 and an n-type semiconductor region 120 (fifth semiconductor region) provided under the p-type semiconductor region 118. The n-type semiconductor region 122 forms the holding portion C2. The n-type semiconductor region 124 forms the drain OFD of the overflow transistor M6.

Above the semiconductor substrate 110 between the n-type semiconductor region 116 and the n-type semiconductor region 120, a gate electrode 128 is provided with a gate insulating film 126 interposed therebetween. Thereby, the transfer transistor M1 is formed in which the n-type semiconductor region 116 is the source, the n-type semiconductor region 120 is the drain, and the gate electrode 128 is the gate. Further, above the semiconductor substrate 110 between the n-type semiconductor region 120 and the n-type semiconductor region 122, a gate electrode 132 is provided with a gate insulating film 130 interposed therebetween. Thereby, the transfer transistor M2 is formed in which the n-type semiconductor region 120 is the source, the n-type semiconductor region 122 is the drain, and the gate electrode 132 is the gate. Further, above the semiconductor substrate 110 between the n-type semiconductor region 116 and the n-type semiconductor region 124, a gate electrode 136 is provided with a gate insulating film 134 interposed therebetween. Thereby, the overflow transistor M6 is formed in which the n-type semiconductor region 116 is the source, the n-type semiconductor region 124 is the drain, and the gate electrode 136 is the gate.

The photoelectric conversion unit D further includes a p-type semiconductor region 138 (third semiconductor region) provided under the n-type semiconductor region 116. Further, the holding portion C1 further includes a p-type semiconductor region 138 (sixth semiconductor region) provided under the n-type semiconductor region 120. The p-type semiconductor region 138 has a function as a depletion suppression layer for suppressing the depletion layer from expanding downward from the n-type semiconductor regions 116 and 120 and has a higher impurity concentration than the p-type semiconductor region 112. In the p-type semiconductor region 138 (third semiconductor region), an opening 140 is provided in a part of a region overlapping with the n-type semiconductor region 116 in a plan view. Note that, in the present specification, the plan view refers to a two-dimensional plan view obtained by projecting each component portion of the solid-state imaging device on a plane parallel to the surface of the semiconductor substrate 110, which corresponds to a planar layout of FIG. 3, for example.

It is preferable for the p-type semiconductor region 138 to be configured to be able to fix the potential thereof. From such a point of view, the p-type semiconductor region 138 is extended in the direction parallel to the surface of the semiconductor substrate 110 and connected to the p-type semiconductor region 112 in the present embodiment. Such a configuration allows the potential of the p-type semiconductor region 138 to be fixed to the potential of the p-type semiconductor region 112 as a well, for example, to the ground potential. Note that a form of connecting the p-type semiconductor region 138 to the p-type semiconductor region 112 is not limited to the example of the present embodiment. For example, a part of the bottom of the p-type semiconductor region 138 may be extended in the depth direction so as to penetrate the n-type semiconductor region 142 and connected to the p-type semiconductor region 112.

FIG. 5A illustrates the plan view of FIG. 3 overlapped with the p-type semiconductor region 138. The p-type semiconductor region 138 is approximately arranged under the photoelectric conversion unit D, the holding portion C1, and the gates of the transfer transistors M1 and M2 and the overflow transistor M6. It is desirable for the opening 140 to be arranged on the holding portion C1 side of a center part 144 of the photoelectric conversion unit D. Note that the center part 144 of the photoelectric conversion unit D in this case may be the centroid of the n-type semiconductor region 116 in the plan view, may be the center of the opening region not covered with interconnections or the like, or may be the center of an optical waveguide when the optical waveguide is arranged over the photoelectric conversion unit D. Typically, the center part 144 is located in substantially the same position of the photoelectric conversion unit D when any of the above definitions is applied. A light entering the pixel 12 is converged to the center part 144 of the photoelectric conversion unit D by a microlens (not illustrated) provided above the photoelectric conversion unit D.

The photoelectric conversion unit D further includes an n-type semiconductor region 142 (fourth semiconductor region) provided under the p-type semiconductor region 138. The n-type semiconductor region 142 is provided in at least a region overlapping with the n-type semiconductor region 116 in the plan view. In the example illustrated in FIG. 4, the n-type semiconductor region 142 is provided so as to extend from a region overlapping with the n-type semiconductor region 116 in the plan view to a region overlapping with the n-type semiconductor region 120 of the holding portion C1 in the plan view. The n-type semiconductor region 116 and the n-type semiconductor region 142 are connected to each other via the opening 140 to form a continuous n-type semiconductor region. On the other hand, the n-type semiconductor region 120 and the n-type semiconductor region 142 are separated from each other by the p-type semiconductor region 138. The n-type semiconductor regions 142 of the adjacent pixels 12 are separated from each other by the p-type semiconductor region 112. Further, the p-type semiconductor region 138 provided under the n-type semiconductor region 116 and the p-type semiconductor region 138 provided under the n-type semiconductor region 120 are provided at the same depth. Further, it can be said that, between the p-type semiconductor region 138 provided under the n-type semiconductor region 116 and the p-type semiconductor region 138 provided under the n-type semiconductor region 120, a region having a lower potential than each of these two p-type semiconductor regions 138 is present.

It is preferable that the portion other than the photoelectric conversion unit D be shielded from light by a light-shielding film 146 from a position as close as possible to the photoelectric conversion unit D. FIG. 4 illustrates the light-shielding film 146 provided above the semiconductor substrate 110. For example, the light-shielding film 146 is arranged to cover at least the entire holding portion C1 with a metal film having an opening 148 in the center region including at least the center part 144 of the photoelectric conversion unit D. Note that, since portions near the gate electrodes 128, 132, and 136 or contact portions connected to the n-type semiconductor regions 122 and 124 cannot be covered with the light-shielding film 146 and may cause leakage of light, it is preferable to separate such gaps of the light-shielding film 146 apart from the holding portion C1 as much as possible.

FIG. 5B illustrates the plan view of FIG. 3 overlapped with a region where the light-shielding film 146 is provided. Note that, in FIG. 5B, depiction of the gate electrodes 128, 132, and 136 or the contact portions connected to the n-type semiconductor regions 122 and 124 is omitted. In the solid-state imaging device according to the present embodiment, it is preferable for the opening 140 provided in the p-type semiconductor region 138 to be covered with the light-shielding film 146 as illustrated in FIG. 5B, for example.

In the solid-state imaging device according to the present embodiment, for the n-type semiconductor region 142, the concentration is designed such that, even when electrons are accumulated in the n-type semiconductor region 116, the most part of the n-type semiconductor region 142 is depleted. On the other hand, for the p-type semiconductor region 138, the concentration is designed such that the entire p-type semiconductor region 138 is not depleted. For example, the following impurity concentration of each portion can be set. For the p-type semiconductor region 112, the impurity concentration (boron concentration) is $1.0 \times 10^{15}$ $cm^{-3}$. For the n-type semiconductor region 116, the impurity concentration (arsenic concentration) is $2.5 \times 10^{17}$ $cm^{-3}$, and the peak position of the impurity concentration is at a depth of 0.2 µm. For the n-type semiconductor region 120, the impurity concentration (arsenic concentration) is $2.5 \times 10^{17}$ $cm^{-3}$, and the peak position of the impurity concentration is at a depth of 0.2 µm. For the p-type semiconductor region 138, the impurity concentration (boron concentration) is $1.0 \times 10^{16}$ $cm^{-3}$, the peak position of the impurity concentration is at a depth of 0.7 µm, and the thickness is 0.8 µm. For the n-type semiconductor region 142, the impurity concentration (phosphorous concentration) is $4.0 \times 10^{14}$ $cm^{-3}$, and the depth of the bottom (interface with the p-type semiconductor region 112) is at 3.0 µm. By setting of the impurity concentration of each portion in such a way, it is possible to realize a state where the most part of the n-type semiconductor region 142 is depleted and the entirety of the p-type semiconductor region 138 is not depleted.

As discussed above, in the solid-state imaging device according to the present embodiment, the p-type semiconductor region 138 is provided under the n-type semiconductor region 116 forming a charge accumulation layer of the photoelectric conversion unit D. One of the purposes of providing the p-type semiconductor region 138 is to increase the saturation charge amount of the n-type semiconductor region 116 as a charge accumulation layer.

With the p-type semiconductor region 138 being provided under the n-type semiconductor region 116, a p-n junction capacitor is formed between the n-type semiconductor region 116 and the p-type semiconductor region 138. As is apparent from the relational function expressed by Q=CV, when a predetermined reverse bias voltage V is applied to the p-n junction of the photoelectric conversion unit D, a larger p-n junction capacitance C results in a larger accumulation charge amount Q. Signal charges accumulated in the n-type semiconductor region 116 are transferred to a signal output portion. However, when the potential of the n-type semiconductor region 116 reaches a predetermined potential determined by the power source voltage or the like, the signal charges of the n-type semiconductor region 116 are no longer transferred. That is, since the variation of the voltage V due to the transfer of signal charges is fixed, the saturation charge amount increases in proportion to the p-n junction capacitance of the photoelectric conversion unit D. Therefore, by providing the p-type semiconductor region 138, it is possible to increase the saturation charge amount of the n-type semiconductor region 116 as a charge accumulation layer.

In the solid-state imaging device including the holding portion C1, however, there is a concern that a noise component leaking into the holding portion C1 may increase due to the p-type semiconductor region 138 being provided. For example, the holding portion C1 may be accumulating signal charges of the previous frame during an exposure period of the photoelectric conversion unit D. Thus, when signal charges based on a light entering the photoelectric conversion unit D leaks into the n-type semiconductor region 120, which may be superimposed on the signal of the previous frame as a noise.

A light converged into the center part 144 of the photoelectric conversion unit D has expansion of the same degree as the wavelength. While the most part of the light transmitted inside the device is absorbed in the n-type semiconductor region 116 and the p-type semiconductor region 114 of the photoelectric conversion unit D, a non-negligible amount of light enters the p-type semiconductor region 138. As a result, pairs of electrons and holes occur also in the p-type semiconductor region 138 by photoelectric conversion. Although the inside of the p-type semiconductor region 138 is a neutral region and there is no electric field, a small portion of electrons generated in the p-type semiconductor region 138 is diffused and leaks into the holding portion C1. When electrons generated in the p-type semiconductor region 138 leaks into the holding portion C1, which may cause a noise. Thus, in the solid-state imaging device having the holding portion C1, it is important how to reduce signal charges that leaks from the p-type semiconductor region 138 into the holding portion C1.

From such a point of view, in the solid-state imaging device according to the present embodiment, the n-type semiconductor region 142 is provided under the p-type semiconductor region 138. As previously described, in the solid-state imaging device according to the present embodiment, the concentration is designed so that the most part of the n-type semiconductor region 142 is depleted. Further, the concentration is designed so that the entire p-type semiconductor region 138 is not depleted. As a result, an electric field occurs in the direction perpendicular to the surface of the semiconductor substrate 110 between the p-type semiconductor region 138 and the n-type semiconductor region 142, the electrons generated in the p-type semiconductor region 138 are pulled to the n-type semiconductor region 116 or the n-type semiconductor region 142, and a ratio of the electrons reaching the holding portion C1 decreases. Thereby, a noise component leaking into the holding portion C1 can be reduced.

Note that Japanese Patent Application Laid-Open No. 2014-165286 discloses that a p-type semiconductor region is arranged under an n-type semiconductor region forming a charge accumulation layer of a photoelectric conversion unit. In Japanese Patent Application Laid-Open No. 2014-165286, however, a p-type semiconductor region (p-type well) is located under the p-type semiconductor region, and thus these p-type semiconductor regions are not depleted. Therefore, if the structure disclosed in Japanese Patent Application Laid-Open No. 2014-165286 were simply applied to a solid-state imaging device having the holding portion C1, such configuration could not prevent electrons generated in the p-type semiconductor region under the charge accumulation layer from being scattered and leaking into the holding portion C1.

The opening 140 serves as a moving path of signal charges when the signal charges generated inside a region deeper than the n-type semiconductor region 116, for example, the n-type semiconductor region 142 are collected to the n-type semiconductor region 116. Therefore, with the opening 140 being provided in the p-type semiconductor region 138, the light-receiving sensitivity can be improved compared to a case where the opening 140 is not provided.

It is preferable for the opening 140 not to include the center portion 144 of the photoelectric conversion D and to be arranged in a position near the holding portion C1. Since the strongest light enters the center part 144 of the photoelectric conversion unit D, the number of charges generated in the p-type semiconductor region 138 is larger. With the opening 140 being provided in a position closer to the holding portion C1 than to the center part 144 of the photoelectric conversion unit D, electrons generated in the p-type semiconductor region 138 near the center part 144 of the photoelectric conversion unit D are pulled into the potential of the opening 140 before reaching the holding portion C1. The electrons pulled into the potential of the opening 140 are captured by the n-type semiconductor region 116 or the n-type semiconductor region 142. Therefore, such an arrangement can further reduce a noise component leaking into the holding portion C1.

In a similar point of view, it is further preferable to arrange the opening 140 in a position that does not overlap with a light incident region. For example, as illustrated in the solid-state imaging device according to the present embodiment, it is preferable to shield the upper part of the opening 140 from light by the light-shielding film 146, a wiring, or the like.

The n-type semiconductor region 142 may be arranged to extend up to under the holding portion C1 as previously described. A small part of a light entering the pixel 12 further enters the under part of the holding portion C1 due to scattering or the like. The n-type semiconductor region 142 extends up to under holding portion C1 and thereby the photoelectric conversion region of a deeper part expands, which allows electrons generated under the holding portion C1 to be also collected in the n-type semiconductor region 116. Thereby, the light-receiving sensitivity can be further improved.

The p-type semiconductor region 138 extending under the n-type semiconductor region 120 provides an advantage of increasing the saturation charge amount of the n-type semiconductor region 120 as a charge accumulation layer in the holding portion C1 similarly to the case of the n-type semiconductor region 116. However, no opening is provided in the p-type semiconductor region 138 between the n-type semiconductor region 120 and the n-type semiconductor region 142, and the n-type semiconductor region 120 is separated from the n-type semiconductor region 142. Such a configuration can prevent charges generated in the n-type semiconductor region 142 and a deeper region thereof from flowing into the n-type semiconductor region 120.

The p-type semiconductor region 138 can be formed by implanting impurity ions with a photoresist opened in a predetermined region as a mask. In this case, the opening 140 can be formed by covering in advance a part of a region overlapping with the n-type semiconductor region 116 by the photoresist in the plan view. The impurity concentration or the depth of the p-type semiconductor region 138 may be different between a region under the n-type semiconductor region 116 and a region under the n-type semiconductor region 120. By doing so, it is possible to design the p-type semiconductor region 138 in accordance with characteristics required for the photoelectric conversion unit D and the holding portion C1 to improve the flexibility of design. In this case, however, since two times of photolithography steps are required, it is preferable to form the p-type semiconductor region 138 at the same time as the formation of the region under the n-type semiconductor region 116 and the region under the n-type semiconductor region 120 in view of reduction in manufacturing cost. In this case, the p-type semiconductor region 138 under the n-type semiconductor region 116 and the p-type semiconductor region 138 under the n-type semiconductor region 120 will be formed at the same depth of the semiconductor substrate and at the same impurity concentration.

As discussed above, according to the present embodiment, charges generated in the p-type semiconductor region 138 can be collected in the n-type semiconductor region 116 of the photoelectric conversion unit D. This can improve the sensitivity of the photoelectric conversion unit D and prevent unintended charges from leaking into the holding portion C1.

Second Embodiment

Figure 6:
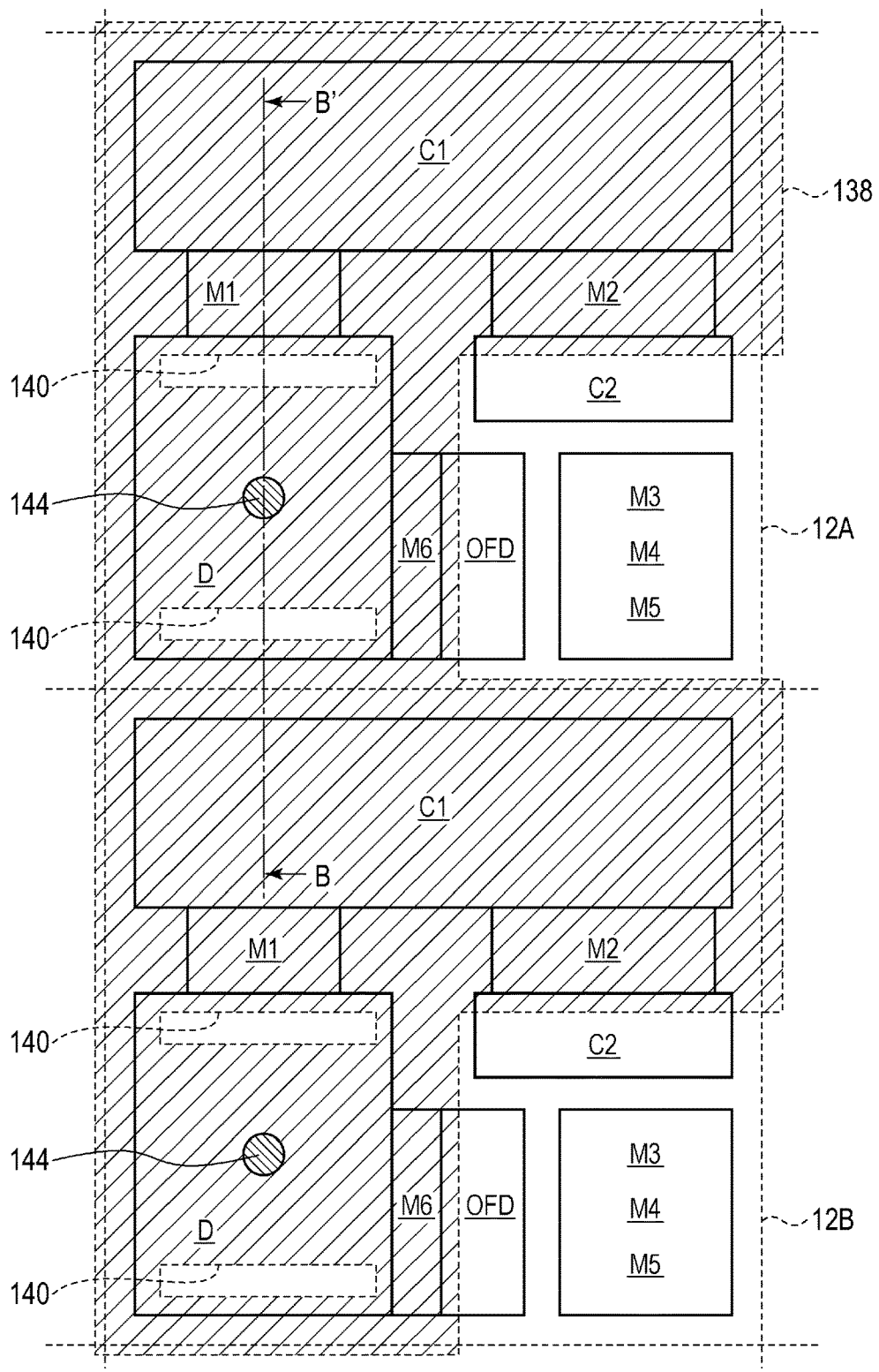
FIG. 6 is a plan view of a pixel of a solid-state imaging device according to a second embodiment of the present invention.
Figure 7:
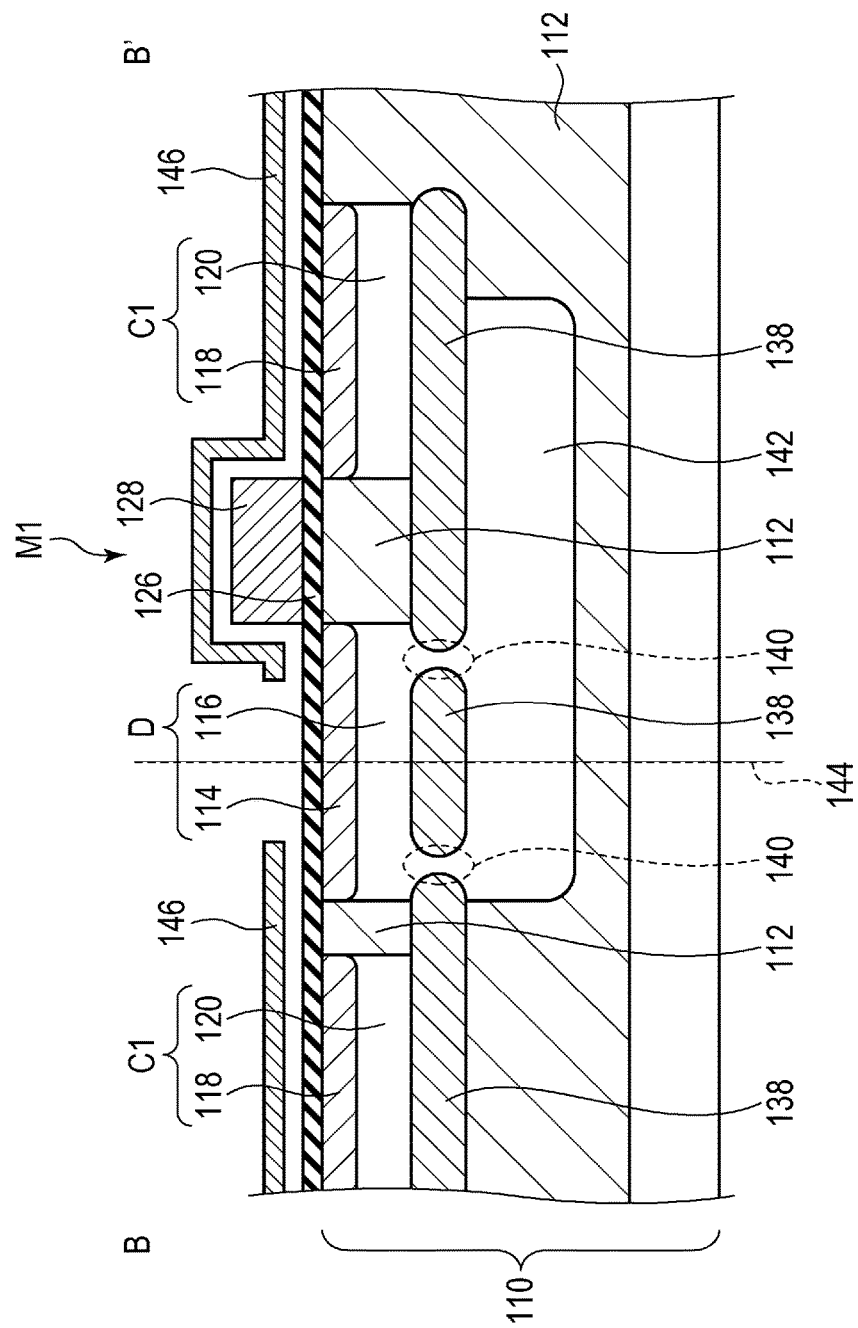
FIG. 7 is a cross-sectional view of the pixel of the solid-state imaging device according to the second embodiment of the present invention.
Figure 8:
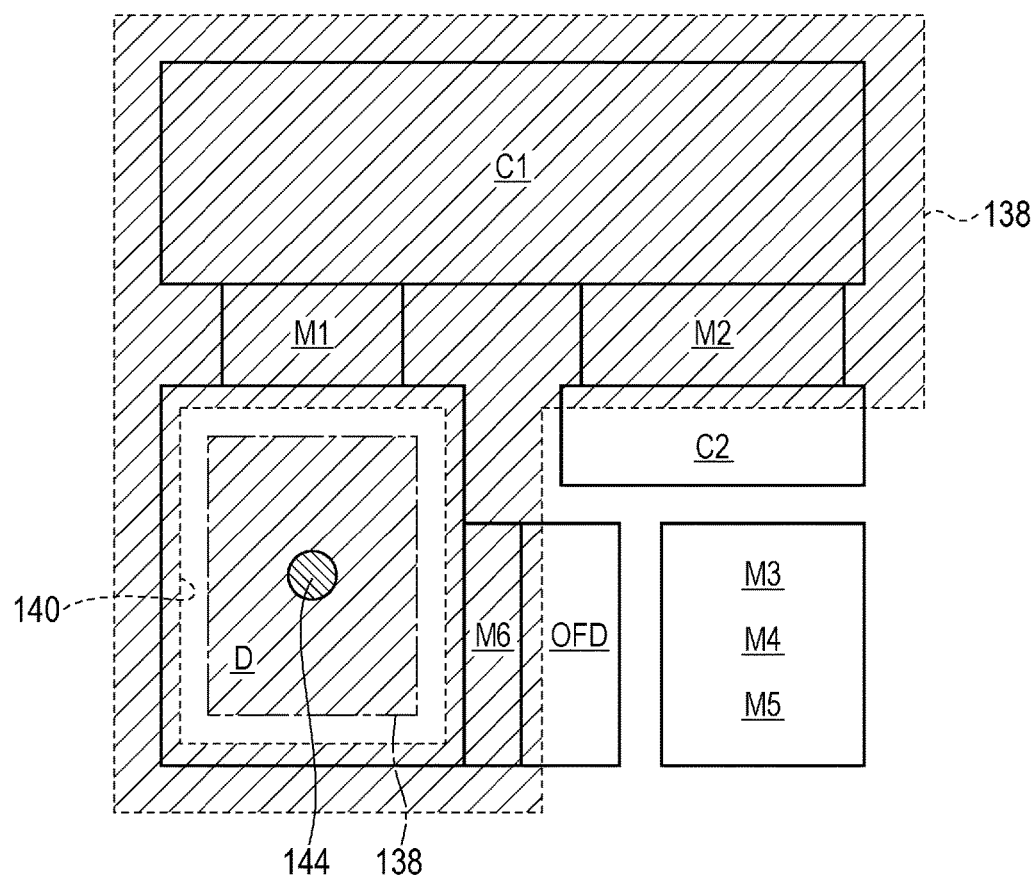
FIG. 8 is a plan view of a pixel of a solid-state imaging device according to a modified example of the second embodiment of the present invention.

A solid-state imaging device according to a second embodiment of the present invention will be described with reference to FIG. 6 to FIG. 8. FIG. 6 is a plan view of a pixel of the solid-state imaging device according to the present embodiment. FIG. 7 is a cross-sectional view of the pixel of the solid-state imaging device according to the present embodiment. FIG. 8 is a plan view of a pixel of a solid-state imaging device according to a modified example of the present embodiment. Similar component as that of the solid-state imaging device according to the first embodiment is labeled with the same reference symbol, and the description thereof will be omitted or simplified.

While leakage of signal charges from the p-type semiconductor region 138 into the holding portion C1 within one pixel 12 has been considered in the first embodiment, the leakage signal charges from the p-type semiconductor region 138 into the holding portion C1 may occur between adjacent pixels 12. In the present embodiment, illustrated is a solid-state imaging device that can suppress leakage of signal charges from the p-type semiconductor region 138 of one pixel (pixel 12A) into the holding portion C1 of another pixel (pixel 12B) adjacent to the one pixel.

In the solid-state imaging device according to the present embodiment, as illustrated in FIG. 6, the pixels 12 having the planar layout illustrated in FIG. 3 are arranged adjacent to each other in the vertical direction in the drawing. When the upper pixel 12 is denoted as a pixel 12A and the lower pixel 12 is denoted as a pixel 12B in FIG. 6, the photoelectric conversion unit D of the pixel 12A is arranged adjacent to the holding portion C1 of the pixel 12B. In the case of such a layout, leakage of signal charges from the p-type semiconductor region 138 of the photoelectric conversion unit D of the pixel A into the holding portion C1 of the pixel 12B may occur.

From such a point of view, in the solid-state imaging device according to the present embodiment, another opening 140 is further provided between the center part 144 of the photoelectric conversion unit D of one pixel (pixel 12A) and the holding portion C1 of another pixel (pixel 12B) adjacent to the one pixel. FIG. 7 is a schematic cross-sectional view taken along the line B-B' of FIG. 6. As illustrated in FIG. 7, the n-type semiconductor region 116 is connected to the n-type semiconductor region 142 via the two openings 140 in the outside of the center part 144 of the photoelectric conversion unit D. With such a configuration, leakage of charges into the holding portion C1 from the p-type semiconductor region 138 under the photoelectric conversion unit D can be reduced in a more reliable manner.

Note that, while the two openings 140 are arranged inside a region overlapping with the n-type semiconductor region 116 in the plan view in the present embodiment, an opening 140 may be arranged to surround a region including the center part 144 of the photoelectric conversion unit D in the plan view as illustrated in FIG. 8, for example. In this case, as described in the first embodiment, a fixed voltage supply to the p-type semiconductor region 138 can be realized by forming a part of the bottom of the p-type semiconductor region 138 to extend in the depth direction and connect to the p-type semiconductor region 112.

As discussed above, according to the present embodiment, charges generated in the p-type semiconductor region 138 can be collected in the n-type semiconductor region 116 of the photoelectric conversion unit D. This can improve the sensitivity of the photoelectric conversion unit D and prevent unintended charges from leaking into the holding portion C1.

Third Embodiment

Figure 9:
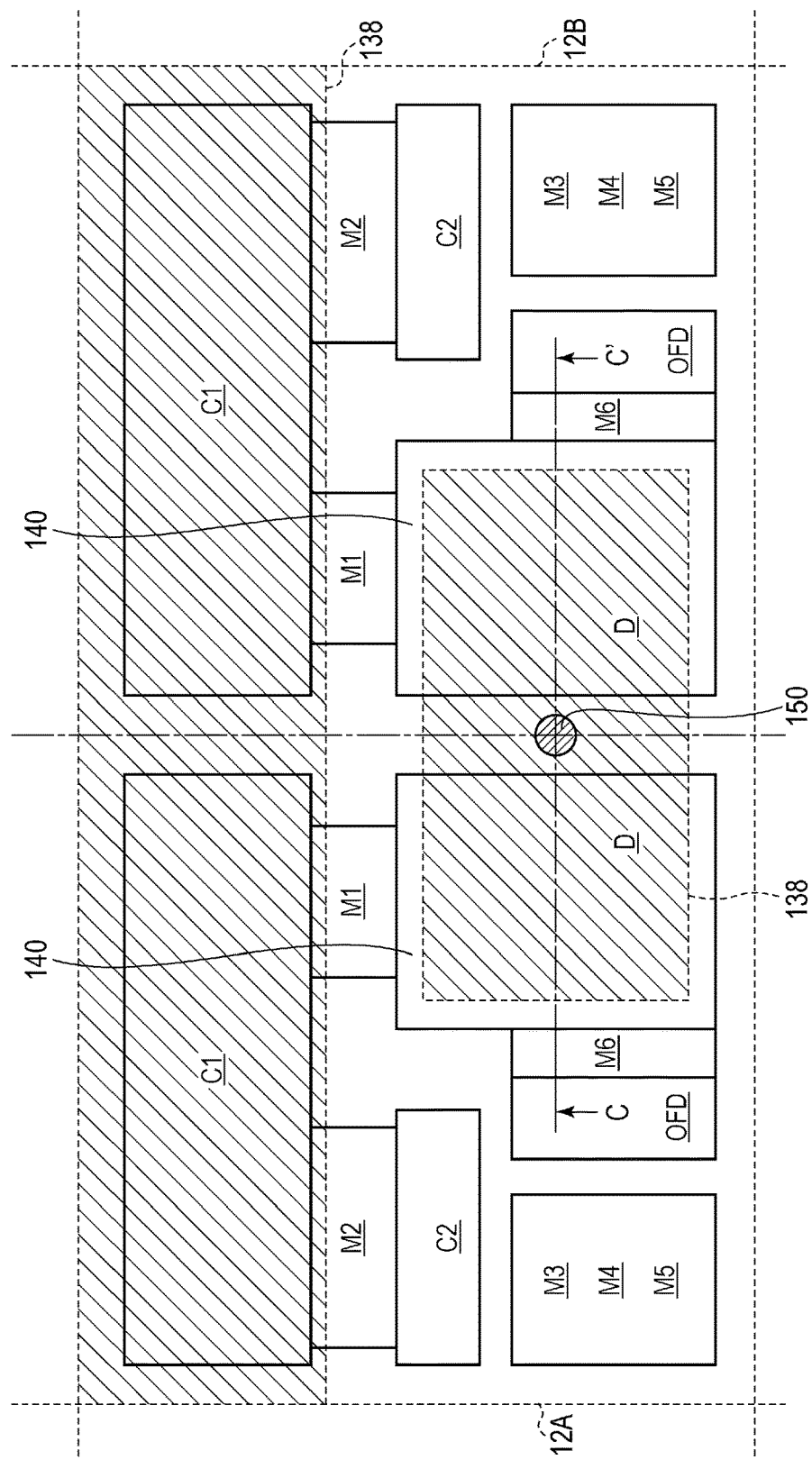
FIG. 9 is a plan view of a pixel of a solid-state imaging device according to a third embodiment of the present invention.
Figure 10:
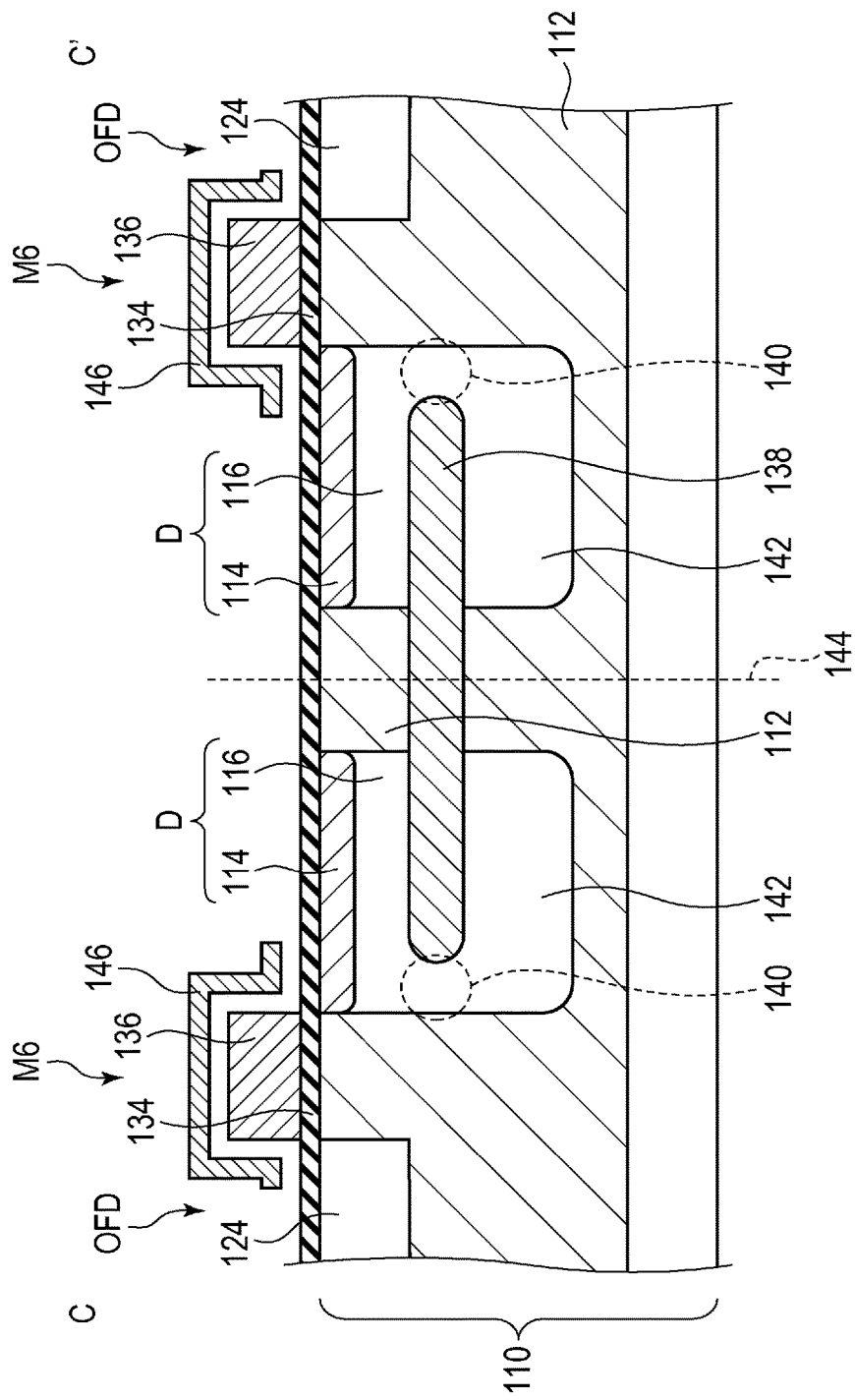
FIG. 10 is a cross-sectional view of the pixel of the solid-state imaging device according to the third embodiment of the present invention.

A solid-state imaging device according to a third embodiment of the present invention will be described with reference to FIG. 9 and FIG. 10. FIG. 9 is a plan view of a pixel of a solid-state imaging device according to the present embodiment. FIG. 10 is a cross-sectional view of the pixel of the solid-state imaging device according to the present embodiment. Similar component as that of the solid-state imaging device according to the first and second embodiments is labeled with the same reference symbol, and the description thereof will be omitted or simplified.

In the solid-state imaging device according to the present embodiment, as illustrated in FIG. 9, the pixels 12 having the planar layout illustrated in FIG. 3 are arranged mirror-symmetrically and adjacent to each other in the horizontal direction in the drawing. When the left side pixel 12 is denoted as a pixel 12A and the right side pixel 12 is denoted as a pixel 12B in FIG. 9, the photoelectric conversion unit D of the pixel 12A is arranged adjacent to the photoelectric conversion unit D of the pixel 12B.

When the openings 140 are arranged to surround a region including the center part 144 of the photoelectric conversion unit D in the plan view, some improvement is required, such as forming the bottom of the p-type semiconductor region 138 to extend in the depth direction and connect to the p-type semiconductor region 112 as described in the modified example of the second embodiment.

On the other hand, when the photoelectric conversion units D of the neighboring pixels 12 are arranged to face each other as seen in the layout illustrated in FIG. 9, the p-type semiconductor regions 138 provided in the photoelectric conversion units D of these two pixels 12 can be formed as a single continuous pattern. Since a p-type semiconductor region (not shown) for isolation between the pixel 12A and the pixel 12B is provided, the p-type semiconductor region 138 formed over the pixels 12 can be connected to the p-type semiconductor regions 112 via the isolating p-type semiconductor region or directly. FIG. 10 is a schematic cross-sectional view taken along the line C-C' of FIG. 9. FIG. 10 illustrates a state where the p-type semiconductor region 138 and the p-type semiconductor region 112 are connected at the boundary between the pixel 12A and the pixel 12B.

Note that the layout of the present embodiment can be applied to a pixel used for focus detection. In this case, a single microlens (not illustrated) that converges a light into the pixel 12 is arranged to the photoelectric conversion unit D of the pixel 12A and the photoelectric conversion unit D of the pixel 12B. The center 150 of a light converged by the microlens is arranged between the photoelectric conversion unit D of the pixel 12A and the photoelectric conversion unit D of the pixel 12B. This enables detection of signals based on lights that have passed through different pupil regions of an optical system, and such signals can be utilized as the focus detection signal.

As discussed above, according to the present embodiment, charges generated in the p-type semiconductor region 138 can be collected into the n-type semiconductor region 116 of the photoelectric conversion unit D. This can improve the sensitivity of the photoelectric conversion unit D and prevent unintended charges from leaking into the holding portion C1.

Fourth Embodiment

Figure 11:
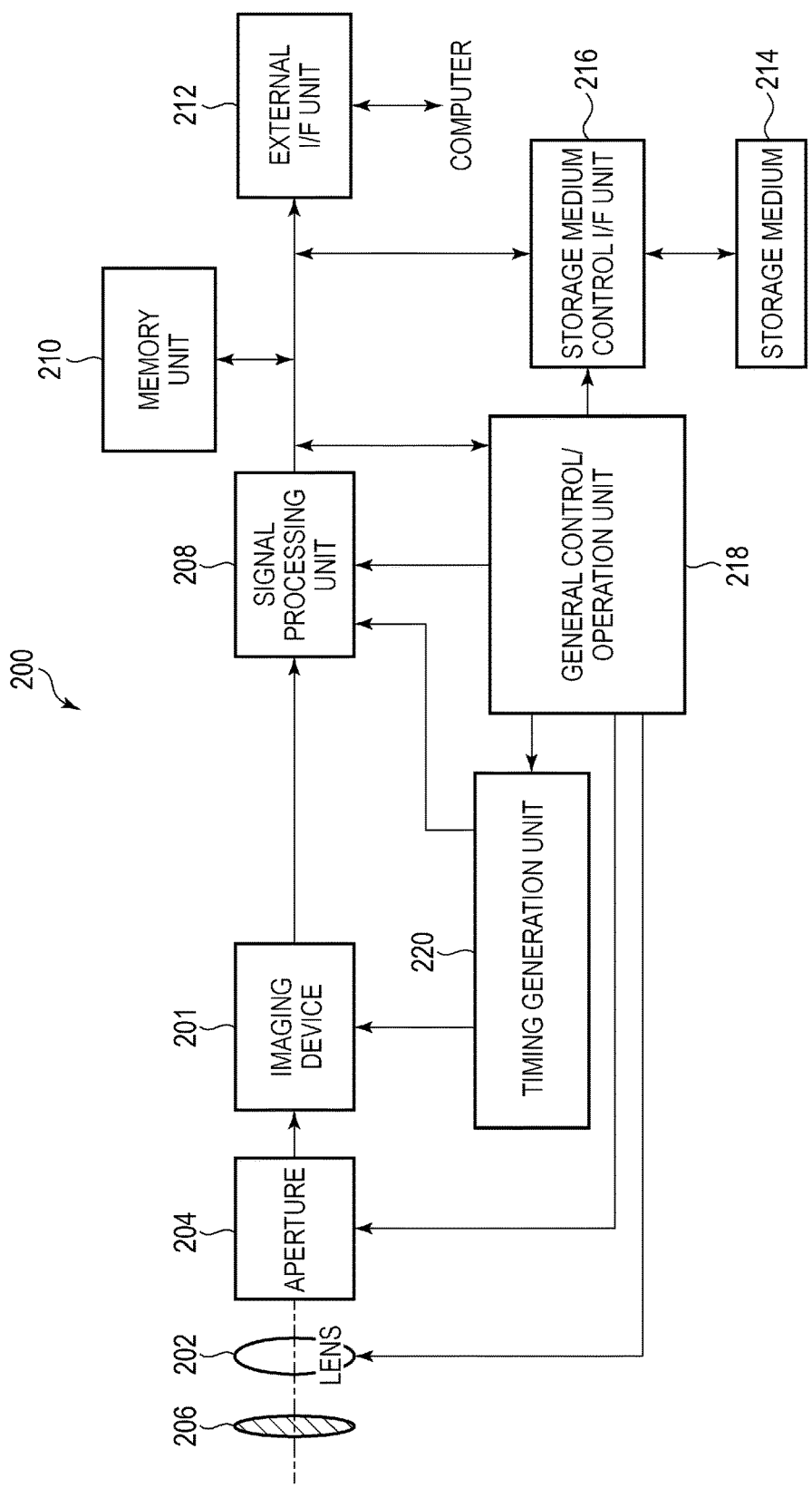
FIG. 11 is a block diagram illustrating a general configuration of an imaging system according to a fourth embodiment of the present invention.

An imaging system according to a fourth embodiment of the present invention will be described with reference to FIG. 11. The similar component as that of the imaging device according to the first to third embodiments is labeled with the same reference symbol, and the description thereof will be omitted or simplified. FIG. 11 is a block diagram illustrating a configuration of the imaging system according to the present embodiment.

The imaging devices 100 described in the above first to the third embodiments can be applied to various imaging systems. Examples of the applicable imaging systems may include a digital still camera, a digital camcorder, a surveillance camera, a copier machine, a fax machine, a mobile phone, an on-vehicle camera, an observation satellite, and the like. Further, a camera module having an optical system, such as a lens, and an imaging device may be included in the imaging system. FIG. 11 illustrates a block diagram of a digital still camera as an example of the above.

The imaging system 200 illustrated as an example in FIG. 11 has the imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is any of the solid-state imaging devices 100 described in the first to third embodiments and converts an optical image captured by the lens 202 into image data.

The imaging system 200 further has a signal processing unit 208 that processes an output signal output from the imaging device 201. The signal processing unit 208 performs AD conversion that converts an analog signal output from the imaging device 201 into a digital signal. Further, the signal processing unit 208 performs other operations of performing various correction or compression if necessary and outputting image data. An AD conversion unit that is a part of the signal processing unit 208 may be formed on the semiconductor substrate in which the imaging device 201 is provided, or may be formed on a different semiconductor substrate from the imaging device 201. Further, the imaging device 201 and the signal processing unit 208 may be formed on the same semiconductor substrate.

The imaging system 200 further has a memory unit 210 for temporarily storing image data therein and an external interface unit (external I/F unit) 212 for communicating with an external computer or the like. The imaging system 200 further has a storage medium 214 such as a semiconductor memory for performing storage or readout of image pickup data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/ operation unit 218 that controls various computation and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201.

The imaging device 201 outputs an imaging signal to the signal processing unit 208. The signal processing unit 208 performs predetermined signal processing on the imaging signal output from the imaging device 201 and outputs image data. The signal processing unit 208 uses the imaging signal to generate an image.

Application of the solid-state imaging device 100 according to any of the first to third embodiments can realize an imaging system that can acquire a good quality image with a high sensitivity and a large saturation charge amount.

Fifth Embodiment

Figure 12A:
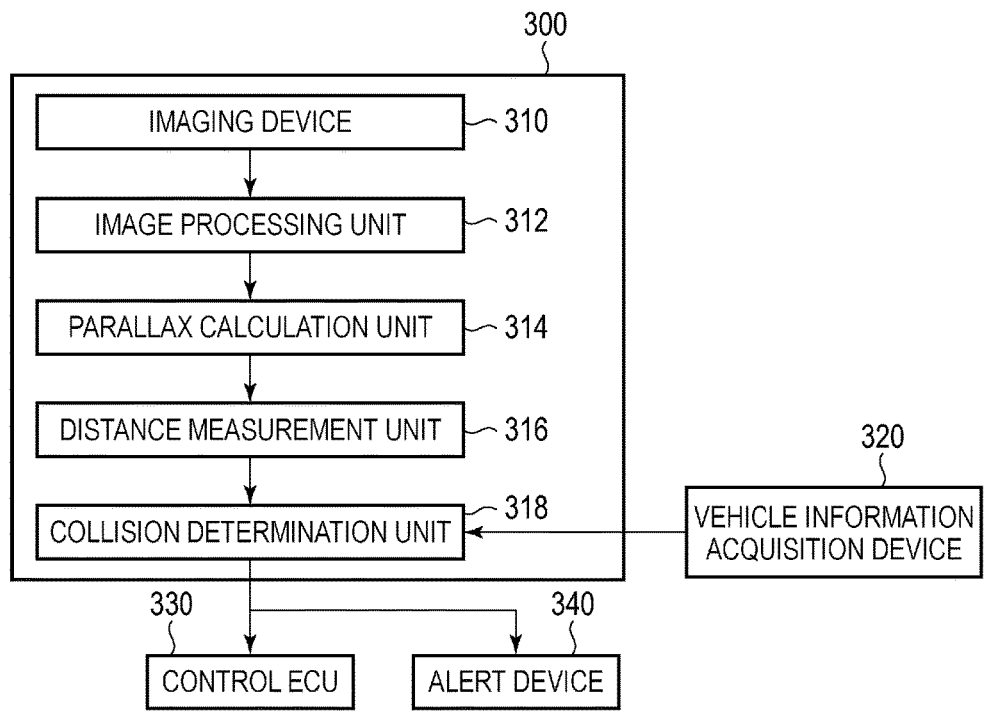
FIG. 12A is a diagram illustrating a configuration example of an imaging system according to a fifth embodiment of the present invention.
Figure 12B:
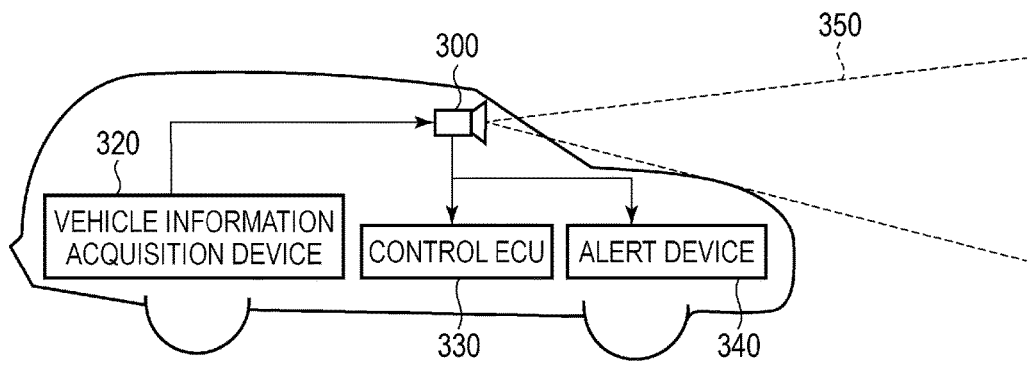
FIG. 12B is a diagram illustrating a configuration example of a movable object according to the fifth embodiment of the present invention.

An imaging system and a movable object according to a fifth embodiment of the present invention will be described by using FIG. 12A and FIG. 12B. FIG. 12A is a diagram illustrating a configuration of the imaging system according to the present embodiment. FIG. 12B is a diagram illustrating a configuration of the movable object according to the present embodiment.

FIG. 12A illustrates an example of an imaging system related to an on-vehicle camera. The imaging system 300 has an imaging device 310. The imaging device 310 is any of the solid-state imaging devices 100 described in the above first to third embodiments. The imaging system 300 has an image processing unit 312 that performs image processing on a plurality of image data acquired by the imaging device 310 and a parallax calculation unit 314 that calculates a parallax (a phase difference of parallax images) from the plurality of image data acquired by the imaging system 300. Further, the imaging system 300 has a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 12B illustrates the imaging system in a case of capturing a front area of a vehicle (a capturing area 350). The vehicle information acquisition device 320 transmits instructions to the imaging system 300 or the imaging device 310. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while the solid-state imaging devices using the photoelectric conversion unit D that generates electrons as signal charges have been described as an example in the above embodiments, the same applies to a solid-state imaging device using the photoelectric conversion unit D that generates holes as signal charges. In this case, the conductivity type of the semiconductor region forming each portion of the pixel 12 is the opposite conductivity type. Note that the names of source and drain of each transistor described in the above embodiments may be different in accordance with the conductivity of the transistor, the function in interest, or the like, and all or a part of the sources and drains described above may be referenced by the opposite names.

Further, while the holding portion C1 has the buried diode structure including the p-type semiconductor region 118 and the n-type semiconductor region 120 in the above embodiments, the configuration of the holding portion C1 is not limited thereto. For example, an electrode may be arranged over the semiconductor substrate 110 via an insulating film without the p-type semiconductor region 118 being arranged on the surface of the semiconductor substrate 110, and a MOS capacitor may be formed between the electrode and the n-type semiconductor region 120. This electrode may be connected to the gate electrode 128 of the transfer transistor M1.

Further, while the solid-state imaging device having a global electronic shutter function has been described as an example in the above embodiments, the present invention can be widely applied to solid-state imaging devices having a holding portion used for temporarily holding signal carriers separately from a photoelectric conversion unit.

Further, the imaging system illustrated in the above embodiments are an example of imaging systems to which the solid-state imaging device of the present invention may be applied, the imaging system to which the solid-state imaging device of the present invention can be applied is not limited to the configuration illustrated in FIG. 11 to FIG. 12B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-054074, filed Mar. 21, 2017, which is hereby incorporated by reference herein in its entirety.

What is claimed is:

1. A solid-state imaging device comprising:
a plurality of pixels each of which includes a photoelectric conversion unit that generates charges by photoelectric conversion;
a first holding portion that holds charges transferred from the photoelectric conversion unit;
a second holding portion that holds charges transferred from the first holding portion; and
an amplifier unit that outputs a signal based on an amount of charges held by the second holding portion,
wherein the photoelectric conversion unit includes:
a second semiconductor region of a second conductivity type adapted to accumulate the generated charges,
a third semiconductor region of a first conductivity type provided under the second semiconductor region, and
a fourth semiconductor region of the second conductivity type provided under the third semiconductor region,
wherein the first holding portion includes:
a fifth semiconductor region of the second conductivity type provided spaced apart from the second semiconductor region, and
a sixth semiconductor region of the first conductivity type provided under the fifth semiconductor region at a depth at which the third semiconductor region is provided,
wherein a semiconductor region having a lower potential than each of the third semiconductor region and the sixth semiconductor region is provided between the third semiconductor region and the sixth semiconductor region,
wherein the semiconductor region is overlapped with the second semiconductor region in a plan view,
wherein in the plan view, the semiconductor region is arranged within an area between a center part of the photoelectric conversion unit and the first holding portion, and
wherein the second semiconductor region, the fourth semiconductor region, and the semiconductor region are overlapped with each other.

2. The solid-state imaging device according to claim 1, wherein the semiconductor region is arranged between a center part of the photoelectric conversion unit and the first holding portion of adjacent another pixel in a plan view.

3. The solid-state imaging device according to claim 1, further comprising a light-shielding film covering the first holding portion,
wherein the light-shielding film extends above the semiconductor region.

4. The solid-state imaging device according to claim 1, wherein the fourth semiconductor region is provided extending under the sixth semiconductor region.

5. The solid-state imaging device according to claim 1, wherein the third semiconductor region and the sixth semiconductor region are provided at the same depth in the semiconductor substrate and have the same impurity concentration.

6. The solid-state imaging device according to claim 1, wherein the photoelectric conversion unit of one pixel and the photoelectric conversion unit of another pixel are arranged adjacent to each other, and the third semiconductor region of the one pixel and the third semiconductor region of the another pixel are connected to each other.

7. The solid-state imaging device according to claim 1,
wherein an impurity concentration of the third semiconductor region is set so that entirety of the third semiconductor region is not depleted, and
wherein an impurity concentration of the fourth semiconductor region is set so that the fourth semiconductor region is depleted when charges are accumulated in the second semiconductor region.

8. The solid-state imaging device according to claim 1,
wherein the photoelectric conversion unit and the first holding portion are provided in a seventh semiconductor region of the first conductivity type, and
wherein the third semiconductor region and the sixth semiconductor region are connected to the seventh semiconductor region.

9. The solid-state imaging device according to claim 8, wherein the third semiconductor region and the sixth semiconductor region each have a higher impurity concentration than the seventh semiconductor region.

10. The solid-state imaging device according to claim 1,
wherein the first holding portion further includes an eighth semiconductor region of the first conductivity type provided in contact with a surface of a semiconductor substrate, and
wherein the fifth semiconductor region is provided under the eighth semiconductor region.

11. An imaging system comprising:
the solid-state imaging device according to claim 1; and
a signal processing unit that processes signals output from the pixels of the solid-state imaging device.

12. A movable object comprising:
the solid-state imaging device according to claim 1;

a distance information acquisition unit adapted to acquire distance information on a distance to an object, from parallax images based on signals from the solid-state imaging device; and a control unit adapted to control the movable object based on the distance information.

13. The solid-state imaging device according to claim 1, wherein the center part of the photoelectric conversion unit is a centroid of the second semiconductor region in the plan view.

14. The solid-state imaging device according to claim 1, further comprising an optical waveguide arranged over the photoelectric conversion unit, wherein the center part of the photoelectric conversion unit is a center of the optical waveguide in the plan view.

15. The solid-state imaging device according to claim 1, further comprising a first semiconductor region of the first conductivity type provided in contact with a surface of a semiconductor substrate, wherein the second semiconductor region is arranged under the first semiconductor region.

16. A solid-state imaging device comprising:

a plurality of pixels each of which includes a photoelectric conversion unit that generates charges by photoelectric conversion;

a first holding portion that holds charges transferred from the photoelectric conversion unit;

a second holding portion that holds charges transferred from the first holding portion; and an amplifier unit that outputs a signal based on an amount of charges held by the second holding portion, wherein the photoelectric conversion unit includes:

a second semiconductor region of a second conductivity type adapted to accumulate the generated charges, and wherein the first holding portion includes:

a fifth semiconductor region of the second conductivity type provided spaced apart from the second semiconductor region, wherein the solid-state imaging device further comprises:

a third semiconductor region of a first conductivity type provided under the second semiconductor region and the fifth semiconductor region, and a fourth semiconductor region of the second conductivity type provided under the third semiconductor region, wherein the third semiconductor region has an opening in a region overlapping with the second semiconductor region in a plan view, wherein, in the plan view, the opening is arranged within an area between a center part of the photoelectric conversion unit and the first holding portion, and wherein the second semiconductor region, the fourth semiconductor region, and the opening are overlapped with each other.

17. The solid-state imaging device according to claim 16, wherein the opening is a semiconductor region having a potential lower than a potential of the third semiconductor region.

18. The solid-state imaging device according to claim 16, wherein the opening is a semiconductor region having a potential lower than a potential of the third semiconductor region.

19. The solid-state imaging device according to claim 16, further comprising an optical waveguide arranged over the photoelectric conversion unit, wherein the center part of the photoelectric conversion unit is a center of the optical waveguide in the plan view.

20. The solid-state imaging device according to claim 16, further comprising a first semiconductor region of the first conductivity type provided in contact with a surface of a semiconductor substrate, wherein the second semiconductor region is arranged under the first semiconductor region.

* * * * *